350-393 SR
10/28/86 XR 4,620,113

United States Patent [19]
Sizer, II et al.

[11] Patent Number: 4,620,113
[45] Date of Patent: Oct. 28, 1986

[54] POCKELS CELL DRIVER

[75] Inventors: Theodore Sizer, II; Irl N. Duling, III, both of Rochester; Carl H. Petras, Cameron; Samuel A. Letzring, Honeoye Falls, all of N.Y.

[73] Assignee: The University of Rochester, Rochester, N.Y.

[21] Appl. No.: 581,144

[22] Filed: Feb. 17, 1984

[51] Int. Cl.[4] .......................... H03K 3/26; H03K 3/86; H02B 5/30
[52] U.S. Cl. .................................... 307/270; 307/246; 328/67; 350/393
[58] Field of Search .................... 350/392, 393, 356; 307/246, 316, 228, 270; 328/67

[56] References Cited
U.S. PATENT DOCUMENTS

| 2,597,013 | 5/1952 | Marchetti | 328/67 |
| 3,268,822 | 8/1966 | Hickey | 328/67 |
| 3,735,153 | 5/1973 | Shukla | 307/246 |
| 4,070,589 | 1/1978 | Martinkovic | 328/67 |

OTHER PUBLICATIONS

J. Phys E: Sci. Instrum, "Laser Pulse Selection with Krytron Triggered Kerr Shutter", A. Penzkofer et al., vol. 14, No. 12, Dec. 1981.

*Primary Examiner*—John S. Heyman
*Assistant Examiner*—B. P. Davis
*Attorney, Agent, or Firm*—Martin LuKacher

[57] ABSTRACT

A Pockels cell driver useful to operate the Pockels cell as an optical shutter to select one or more laser pulses out of a train of laser pulses when the Pockels cell is placed between crossed polarizers. The Pockels cell is connected through a storage capacitor, of higher capacitance than the capacitance of the Pockels cell, directly to a high voltage source and is charged to high voltage. The cell is charged and the storage capacitor is discharged through a microwave triode which is triggered by an avalanche transistor switch circuit. By directly charging the Pockels cell, lower currents are used than with conventional Pockels cell drivers using transmission lines to connect to the Pockels cell and gas filled tubes to switch a pulse-forming line. The Pockels cell shutter can be operated to provide transmission intervals for the laser pulses of the order of a nanosecond at high repetition rates, up to 10 KHz, without jitter in the timing of the transmission interval and for long periods of time without frequent need for replacement of the microwave triode.

15 Claims, 7 Drawing Figures

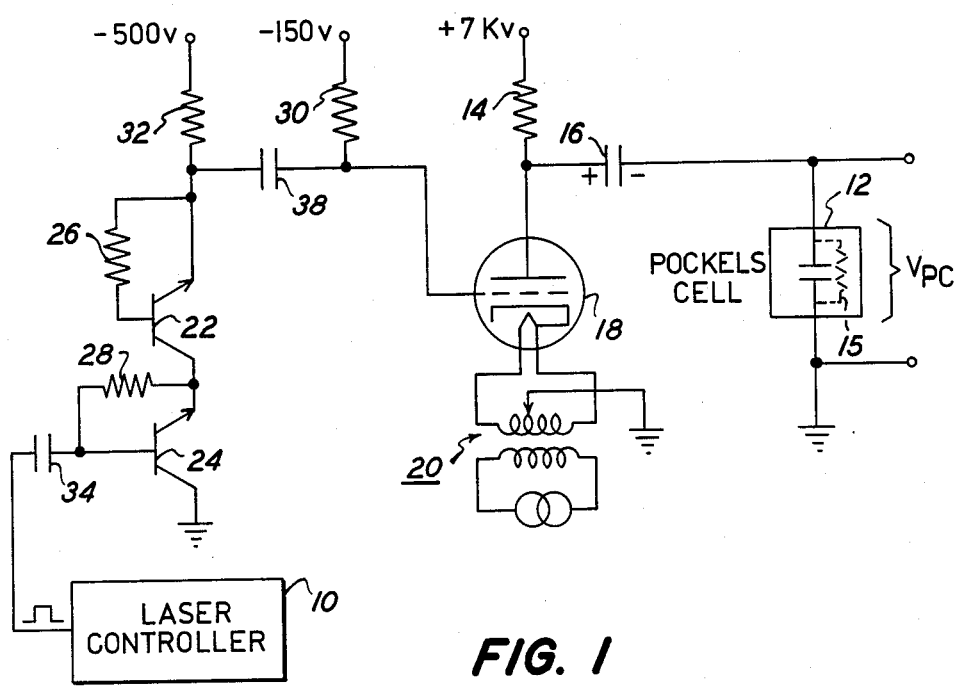
FIG. 1
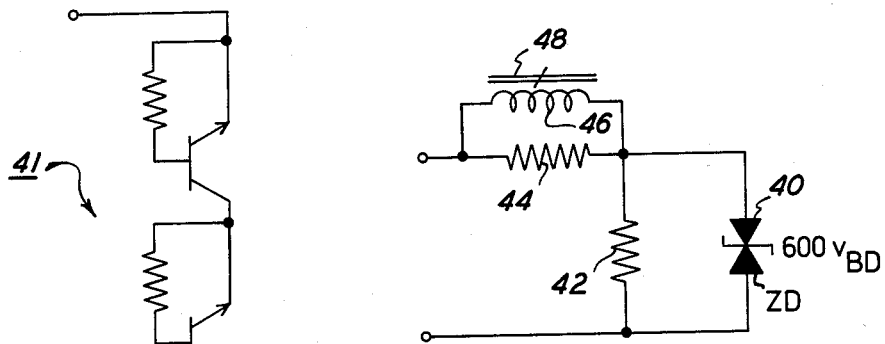
FIG. 4A
FIG. 4B

POCKELS CELL DRIVER

DESCRIPTION

The present invention relates to optical shutters utilizing Pockels cells, and particularly to a driver circuit for a Pockels cell to enable it to be repetitively driven at high repetition rates with minimal jitter for long periods of time without replacing circuit components.

Optical shutters using Pockels cells consist of crossed polarizers between which the cell is located. A transmission line, known as a charge line, is connected to the cell and is charged or discharged through a switch, usually a gas tube switch, so as to control the transmission of polarized light, usually from a laser, through the cell. By timing the discharge of the line, one or more laser pulses may be switched out or selected for use from a burst of pulses from the laser. Where charge lines have not been used, capacitors have instead been used, charged to high voltage and then discharged through avalanche transistor stacks to develop the voltages for controlling the polarization presented by the Pockels cell. U.S. Pat. Nos. 3,577,097 and 3,849,732 show the use of charge lines in Pockels cell driver circuits. The use of avalanche strings of transistors and storage capacitors in Pockels cell drivers is shown in U.S. Pat. No. 3,910,679.

The switching of high currents has been found to result in destruction of the switching device; usually the gas tube, in cases where charged lines are used. Jitter in the timing of the transmission through the Pockels cell occurs, such that precise timing of the switch-out, with respect to the time of a control signal or trigger pulse is not reproducible. Moreover, the time between shots when the shutter can be opened is long and the repetition rate is limited, for example, to less than 100Hz.

It has been found in accordance with the invention that if the magnitude of the current which is switched in order to open the Pockels cell shutter can be limited, the lifetime of the circuit components, particularly the tube used in the driver circuit can be increased and jitter reduced by charging the Pockels cell with current from a storage capacitor charged from a high voltage source in a charging circuit having a time constant much shorter than the repetition rate of the driver, and then discharging the storage capacitor while charging the cell through a microwave triode which is triggered to conduct for a period of time sufficient to enable the cell to charge. In this way gas tubes are eliminated, as are avalanche transistor strings for carrying of high discharge currents. Rapid cycling (high frequency operation) up to 10KHz may be obtained. The driver circuit can also be implemented with fewer components and at lower cost than conventional Pockels cell driver circuits.

Briefly described, a Pockels cell driver circuit embodying the invention utilizes a microwave triode and means for selectively triggering the triode into conduction for short periods of time. The anode of the triode is connected to a high voltage supply through a high resistance, current limiting resistor. The junction between the current limiting resistor and anode is connected to the Pockels cell through a storage capacitor having a capacitance much higher (typically 10 times greater) than the capacitance presented by the Pockels cell. The Pockels cell and the storage capacitor in series are connected across the triode. Thus, when the triode is triggered, the Pockels cell charges, and the voltage across it passes through its half wavelength voltage where the polarization presented by the cell enables transmission of polarized light through the cell and its cooperating crossed polarizers.

An overvoltaged avalanche device, such as an avalanche transistor stack, may be connected across the Pockels cell so as to provide a discharge path for the Pockels cell when the half wavelength voltage is reached so that a transmission interval cannot occur until the next shot or cycle when the triode is again triggered.

The foregoing and other features and advantages of the invention, as well as a presently preferred embodiment thereof, will become more apparent from a reading of the following description in connection with the accompanying drawings in which:

FIG. 1 is a schematic diagram of a Pockels cell driver embodying the invention;

FIGS. 4A and 4B are schematic diagrams of circuits which may be connected across the Pockels cell shown in FIG. 1 in order to prevent reopening of the shutter more than once during a cycle of operation of the circuit.

Figure 2:
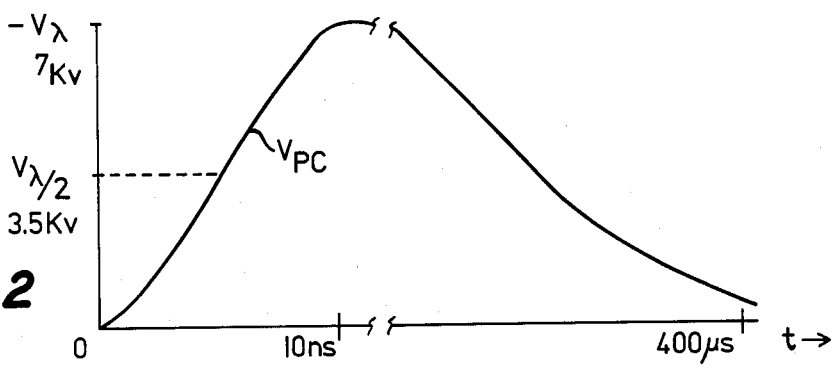
FIG. 2 is a curve showing the voltage across the Pockels cell during a cycle of operation of the circuit shown in FIG. 1.

Referring to FIG. 1, there is shown a laser controller 10 which may be a photo-electrically controlled device, including a photo-cell or photo-transistor driven by the laser, pulses from which are to be switched out by a shutter including cross polarizers (not shown) and a Pockels cell 12. The Pockels cell 12 is connected to a source of high voltage, indicated as 7 kilvolts (KV) through a current limiting resistor 14 and a charge storage capacitor 16. The resistance of this resistor 14 may suitably be two-megohms. The capacitance of the storage capacitor 16 is suitably much higher than the capacitance presented by the Pockels cell 12. For example, the ratio of capacitance may be 10 to 1. With a 10 picofarad (pf) Pockels cell, the storage capacitor 16 may have a capacitance of 50 pf. The Pockels cell 16 has an internal resistance shown in dash lines as a shunt resistor 15, which has a D.C. resistance which is approximately ten megohms at the maximum voltages in the circuit. The time constant of the cell 12 is of the same order of magnitude and in this example equal to the charging time constant of the current limiting resistor 14 and the storage capacitor 16. Thus, the voltage across the Pockels cell is at ground (zero volts) at the beginning of each cycle or shot (see FIG. 2).

When current flows through the resistor 14, the capacitor 16 charges to supply voltage (7KV in this example). A reliable, long life and jitter free transmission interval is obtained through the use of a microwave triode tube 18, suitably a Varian type Y-690. This tube has an anode, a grid and a cathode. Filament current is supplied through a filament transformer 20; the center tap of the secondary of which is grounded. The triode is therefore connected across the series connected Pockels cell 12 and storage capacitor 16. No charge lines are used to develop the voltage across the Pockels cell. The storage capacitor 10 is discharged directly through the microwave triode 18, and the Pockels cell is charged directly, from the current due to the charge stored in the capacitor 16, through the triode 18.

Discharge for a period of time less than ten nanoseconds is obtained by an avalanche transistor stack utilizing two transistors 22 and 24 of the NPN type. The bases and emitters of these transistors are interconnected by ringing suppression resistors 26 and 28. The triode 18 is normally biased off by a −150 volt bias voltage through a resistor 30. The avalanche transistor stack is connected between ground and a −500 volt supply through a resistor 32. The avalanche transistors 22 and 24 may be of different type such that the hold off voltage of the stack exceeds 500 volts. The transistors 22 and 24 are nonconductive until a control or trigger pulse from the laser controller 10 is applied to the base of the lower transistor 24 through a coupling capacitor 34. The transistor stack then becomes conductive. A positive voltage much higher than the bias voltage is developed across the resistor 32 upon current flow through the avalanche transistor stack and is coupled through a capacitor 38 to the grid of the triode 18. The triode then conducts for a short period of time, for example 10 nanoseconds sufficient to permit the capacitor 16 to discharge and the cell 12 to charge. The conduction period may be less (5 nanoseconds) where the circuits of FIG. 4 are used.

Figure 3:
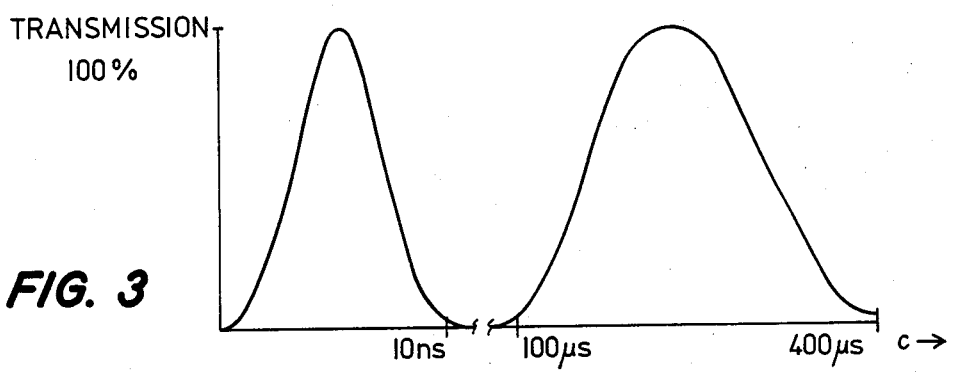
FIG. 3 is a curve showing the transmission interval (shutter open) of a shutter having crossed polarizers between which the Pockels cell driven by circuit shown in FIG. 1 is located.

As shown in FIG. 2, the voltage across the Pockels cell rapidly increases from zero volts through its half wavelength voltage (indicated as 3.5KV) as the cell charges. At 3.5KV, the polarization presented by the cell 12 is rotated so that transmission of a laser pulse in precise, jitter free time relationship with the trigger pulse is permitted. The transmission interval, as shown in FIG. 3, is approximately 3 to 4 nanoseconds in duration. As the voltage across the Pockels cell 12 increase to 7KV, the polarization presented by the cell is again rotated and transmission is blocked. Thus one pulse from the laser can be selected or switched out. After the triode 18 is cut off, the storage capacitor 16 can be charged through the current limiting resistor 14. The discharge time constant of the Pockels (the product of the cell capacitance and its internal resistance 15) is approximately the same as the charging time constant of the storage capacitor and the resistor 14. Thus after the triode 18 cuts off, the Pockels cell 12 cannot recharge from the supply voltage, while the storage capacitor recharges. The voltage across the Pockels cell 12 decreases and passes through the half wavelength voltage well after the burst of laser pulses has expired. This is shown in FIG. 2 and in FIG. 3 as more than 200 microseconds after the trigger pulse. It will be noted that the time scale on the time axis of FIGS. 2 and 3 changes for the charging time after the tube 18 cuts off.

Optionally, it may be desired to prevent the Pockels cell voltage passing through the half wavelength voltage more than once in a full cycle of operation. The circuits shown in FIG. 4 may then be used.

In FIG. 4A, a stack 41 of avalanche transistors is connected across the Pockels cell. A sufficient number of transistors is used to hold off the half wavelength voltage. Suitably ten transistors, each having a hold off voltage of about 400 volts, may be used in the stack 41. Then, when the voltage across the Pockels cell reaches the half wavelength voltage, the Pockels cell discharges through the stack 41.

The circuit shown in FIG. 4B includes an avalanche device, suitably a varistor 40. This diode may be of the type used in lightning or over-voltage suppression circuits and is designed to break down at approximately 600 volts. The zener diode is connected across the lower value resistor 42 of a voltage divider made up of the resistor 42 and another resistor 44. An inductor or choke 46 having a saturable core 48 is connected across the lower value resistor 44. The inductor 46 and resistor 44 constitutes a delay circuit such that the zener diode does not see a voltage sufficient to cause zener breakdown until the voltage across the Pockels cell exceeds the half wavelength voltage. When circuits shown in FIG. 4 are used and the avalanche breakdown is set at 7KV, Pockels cells of the single crystal type can be driven with a supply voltage of which need not be much more than the 7KV half wavelength voltage. The supply voltage can even be less than shown and may be slightly higher than the half wavelength voltage (3.5 KV) when the FIG. 4 circuits are used with a double crystal Pockels cell.

Figure 5A:
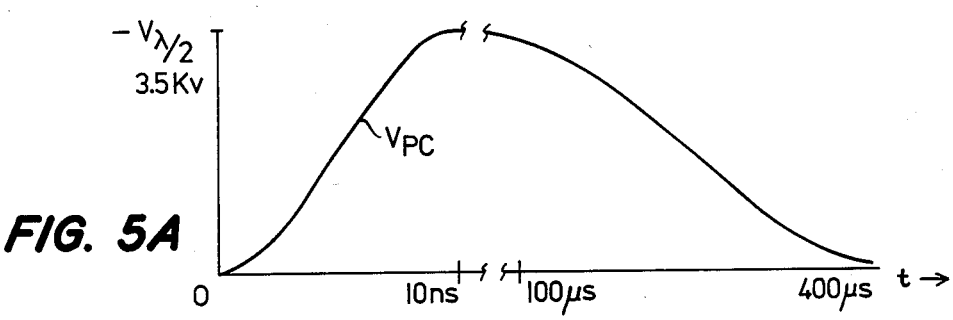
FIGS. 5A and 5B are curves showing the voltage across the Pockels cell and the transmission interval of the shutter for step transmission of a burst of laser pulses.
Figure 5B:
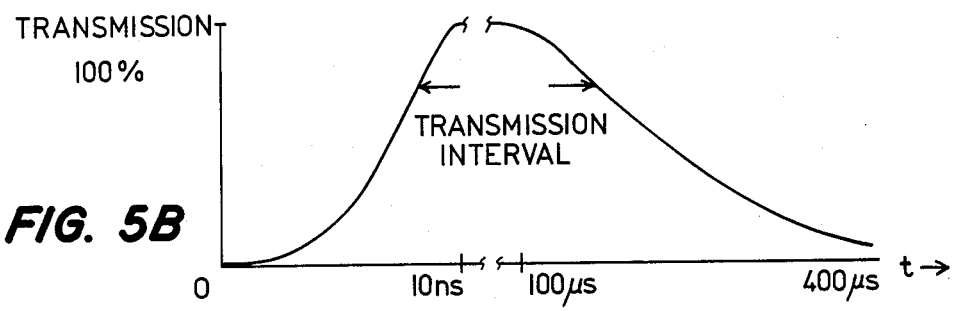

FIG. 5A shows the voltage across Pockels cell where the supply voltage is the half wavelength voltage of the Pockels cell. This is 3.5KV in the case of a double crystal Pockels cell. Due to the slow discharge of the Pockels cell, the voltage across it stays at approximately the half wavelength voltage for about 150 microseconds. This provides a transmission interval whereby a train or burst of laser pulses may be passed through a shutter containing the Pockels cell. FIG. 5B illustrates the transmission interval.

From the foregoing description it will be apparent that there has been provided an improved Pockels cell driver. While presently preferred embodiments of the invention have been illustrated, variations and modifications therein, within the scope of the invention, will undoubtedly suggest themselves to those skilled in the art. Accordingly, the foregoing description should be taken as illustrative and not in a limiting sense.

We claim:

1. A Pockels cell driver which comprises a vacuum tube having a cathode, a grid and an anode, a resistor connecting said anode to a source of voltage at least as high as the half wavelength voltage of the Pockels cell, a storage capacitor connecting the anode to one end of the Pockels cell, means connecting the other end of the Pockels cell to the cathode of said tube, and means connected to the grid of said tube for switching said tube into conduction for a period of time sufficient to discharge said storage capacitor and to charge the capacitance presented by the Pockels cell to increase the voltage across the Pockels cell at least to the half wavelength voltage thereof.

2. The Pockels cell driver according to claim 1 wherein said tube is a microwave triode.

3. The Pockels cell driver according to claim 1 wherein said switching means comprises switching transistor means, a second capacitor connected between said switching transistor means and the grid, means for charging said second capacitor to a voltage of magnitude and polarity to bias said triode to cut-off, and means for triggering said switching transistor means to conduct to discharge said capacitor and present a voltage to said grid sufficient to render said triode conductive for said period of time.

4. The Pockels cell driver according to claim 3 wherein said switching transistor means comprises a plurality of transistors arranged in a stack, and means for applying a trigger pulse to one of said transistors for rendering it conductive.

5. The Pockels cell driver according to claim 4 further comprising a second resistor connecting a second source of voltage to the grid and one side of said second capacitor sufficient to bias said triode to cut-off and a third resistor connecting a third source of voltage higher than and of the same polarity as the voltage of said second source to the other side of said second capacitor and to one end of said stack.

6. The Pockels cell driver according to claim 1 wherein the time constant presented by said resistor and said storage capacitor and the time constant presented by the capacitance and internal resistance of the Pockels cell are of the same order of magnitude.

7. The Pockels cell driver according to claim 1 wherein the capacitance of said storage capacitor is higher than the capacitance of the Pockels cell.

8. The Pockels cell driver according to claim 6 further comprising circuit means containing an avalanche device connected across the Pockels cell for discharging the capacitance of said cell when the voltage thereacross reaches the half wavelength voltage.

9. The Pockels cell driver according to claim 8 wherein said avalanche device is a varistor, having a breakdown voltage less than the half wavelength voltage, a voltage divider having at least two resistors of different resistance value connected in series, said divider being connected across the Pockels cell, said varistor being connected across the lower value one of said divider resistors.

10. The Pockels cell driver according to claim 9 further comprising an inductor connected across the higher value one of said resistors to define a delay circuit therewith.

11. The Pockels cell driver according to claim 8 wherein said circuit means comprises an avalanche transistor stack.

12. The Pockels cell driver according to claim 6 wherein the voltage of said source of voltage is approximately equal to said half wavelength voltage whereby the voltage across said Pockels cell remains in the range of said half wavelength voltage which is sufficient to enable transmission of polarized light through the cell for a predetermined period of time of the order of 100 microseconds.

13. Pockels cell light transmission control apparatus which comprises a Pockels cell having a capacitance and internal resistance defining a first time constant, a resistor and a capacitor connecting said cell to a source of voltage sufficient to render said cell transmissive to a certain polarization of light, said resistor and capacitor presenting a time constant of the same order of magnitude as said cell and its internal resistance, and means connected between the junction of said resistor and capacitor and to complete a current path through said capacitor and said cell for discharging said capacitor and charging said cell.

14. The apparatus according to claim 13 wherein said means comprises a vacuum tube, and means for triggering said tube into conduction.

15. The apparatus according to claim 13 further comprising means including an avalanche device for discharging said cell when the voltage thereacross reaches a voltage at least equal to the half wavelength voltage of said cell.

* * * * *